United States Patent
Chiang et al.

(10) Patent No.: US 8,492,801 B2
(45) Date of Patent: Jul. 23, 2013

(54) SEMICONDUCTOR STRUCTURE WITH HIGH BREAKDOWN VOLTAGE AND RESISTANCE

(75) Inventors: Chiu-Chih Chiang, Hsinchu (TW); Chih-Feng Huang, Jhubei (TW)

(73) Assignee: System General Corp., Taipei (TW)

( * ) Notice: Subject to any disclaimer, the term of this patent is extended or adjusted under 35 U.S.C. 154(b) by 701 days.

(21) Appl. No.: 11/798,206

(22) Filed: May 11, 2007

(65) Prior Publication Data
US 2008/0278279 A1 Nov. 13, 2008

(51) Int. Cl.
*H01L 29/66* (2006.01)
(52) U.S. Cl.
USPC ...... 257/254; 257/350; 257/358; 257/E27.01; 257/E27.034
(58) Field of Classification Search
USPC ............... 257/380, 528, 358, 154, 350, 379, 257/E27.01, E27.034, E29.235, E29.346, 257/359, 542, E29.326, E21.004, E21.363, 257/E27.016, 145, 363, 543, 541, E27.047, 257/E29.325, E27.035, E27.071, E29.176, 257/9, E27.031, E27.023, E27.032, E27.033, 257/536–538, 150; 438/383; 338/11
See application file for complete search history.

(56) References Cited

U.S. PATENT DOCUMENTS

| | | | | |
|---|---|---|---|---|
| 4,263,518 A * | 4/1981 | Ballatore et al. | ............... | 327/565 |
| 5,111,269 A * | 5/1992 | Tsugaru | ......................... | 257/582 |
| 5,352,923 A * | 10/1994 | Boyd et al. | ..................... | 257/536 |
| 5,920,096 A * | 7/1999 | Lee | ................. | 257/355 |
| 6,303,961 B1 * | 10/2001 | Shibib | ............................ | 257/335 |
| 2003/0197588 A1 * | 10/2003 | Chang et al. | ...................... | 338/9 |
| 2004/0036144 A1 * | 2/2004 | Voorde et al. | ................. | 257/543 |
| 2005/0161767 A1 * | 7/2005 | Sugihara | ......................... | 257/536 |
| 2006/0226512 A1 * | 10/2006 | Cottin et al. | .................. | 257/537 |
| 2007/0178636 A1 * | 8/2007 | Nishibe et al. | ................ | 438/210 |

* cited by examiner

*Primary Examiner* — Cuong Q Nguyen
*Assistant Examiner* — Yosef Gebreyesus
(74) *Attorney, Agent, or Firm* — Bacon & Thomas, PLLC

(57) ABSTRACT

A semiconductor structure with high breakdown voltage and high resistance and method for manufacturing the same. The semiconductor structure at least comprises a substrate having a first conductive type; a deep well having a second conductive type formed in the substrate; two first wells having the first conductive type and formed within the deep well; a second well having the first conductive type and formed between the two first wells within the deep well, and an implant dosage of the second well lighter than an implant dosage of each of the two first wells; and two first doping regions having the first conductive type and respectively formed within the two first wells.

12 Claims, 3 Drawing Sheets

SEMICONDUCTOR STRUCTURE WITH HIGH BREAKDOWN VOLTAGE AND RESISTANCE

BACKGROUND OF THE INVENTION

1. Field of the Invention

The invention relates in general to a semiconductor structure and method for manufacturing the same, and more particularly to the semiconductor structure with high breakdown voltage and high resistance, and method for manufacturing the same.

2. Description of the Related Art

In the manufacture of semiconductor device, it is one of the important goals to construct a resistor with high resistance and ideal I-V curve. Semiconductor structures of FIG. 1 and FIG. 2 both schematically show P-well resistors; however, each possesses its own advantages and disadvantages. FIG. 1 is a cross-sectional view of a conventional resistor device. The conventional resistor 1 includes a P-substrate (ex: a P-type silicon substrate) 10, a N deep well 12 formed in the P-substrate 10, two P-wells 13a and 13b formed within the P-substrate 10 and respectively next to the N deep well 12, a P-well 14 formed within the N deep well 12, two P+ regions 17a and 17b formed within the P-well 14, and a N+ region 19 formed within the N deep well 12 and spaced apart from the P-well 14. Also, the P-wells 13a and 13b are implanted with a higher implant dosage than the P-well 14. Furthermore, a low voltage end (LV) is connected to the P+ region 17a, and a high voltage end (HV) is connected to the P+ region 17b and the N+ region 19 within the N deep well 12 for the purpose of preventing parasitic device (pnp) from being turned on at any moment.

FIG. 2 presents a typical I-V curve of the conventional resistor device of FIG. 1. For the structure of the resistor 1 of FIG. 1, junction breakdown typically happens at the interface between the N deep well 12 and the P-well 13a/13b. When the semiconductor structure 1 is operated at the voltage V1, junction breakdown happens and the current increases sharply, as shown in FIG. 2. According to the I-V curve of FIG. 2, the resistor 1 of FIG. 1 possesses "hard breakdown" characteristics. Typically, the operating voltage of the resistor 1 is less than voltage V1, the disadvantage of the resistor is that the resistance of the semiconductor structure 1 determined by the P-well 14 is relatively small.

FIG. 3 is a cross-sectional view of another conventional resistor device. The resistor 3 includes a P-substrate (ex: a P-type silicon substrate) 30, a N deep well 32 formed in the P-substrate 30, two P-wells 33a and 33b formed within the P-substrate 30 and respectively next to the N deep well 32, a P-body 35 formed within the N deep well 32, two P+ regions 37a and 37b formed within the P-body 35, and a N+ region 39 formed within the N deep well 32 and spaced apart from the P-body 35. The P-wells 33a and 33b are implanted with a higher implant dosage than the P-body 35 for a better insulation operation. Similarly, a low voltage end (LV) is connected to the P+ region 37a, and a high voltage end (HV) is connected to the P+ region 37b and the N+ region 39.

The differences between the resistors 1 and 3 are the portions for determining the resistance of the structure (i.e. the P-well 14 and the P-body 35). The implant dosage of the P-body 35 is lighter than the implant dosage of the P-well 14; therefore, the resistance of the semiconductor structure 3 is larger than the resistance of the semiconductor structure 1.

In the current applications, higher resistance of a fixed size resistor device and a high and hard-breakdown voltage are more favorable and practical. While the resistor can be smaller with higher resistance, and if the breakdown voltage is relatively higher, the application range will be wider with a higher operation voltage. Furthermore, it can be observed more easily and stable in the hard-breakdown voltage characteristic.

Although it is an attempt to manufacture a resistor with high resistance, the semiconductor structure 3 has several considerable problems, for example, not suitable for being operated at a high voltage. FIG. 4 presents a typical I-V curve of the conventional resistor device of FIG. 3. For the structure 3 of FIG. 3, junction breakdown typically happens at the interface between the P-body 35 and the P+ region 37a/37b. When the semiconductor structure 3 is operated between the voltage V2 and the voltage V2', the current leakage is observed, and junction breakdown doesn't happen obviously until the operating voltage reaching the voltage V2'. According to the I-V curve of FIG. 4, the semiconductor structure 3 of FIG. 3 possesses "soft breakdown" characteristics which is undesirable in application. Typically, the operating voltage of the semiconductor structure 3 is less than voltage V2. Compared to the operating voltage of the semiconductor structure 1, voltage V2 is relatively smaller than voltage V1. Thus, the semiconductor structure 3 is not suitable for being operated at a high voltage.

SUMMARY OF THE INVENTION

It is therefore an object of the present invention to provide a semiconductor structure with high breakdown voltage and high resistance. A method for manufacturing the structure is also presented.

In one embodiment, the invention achieves the above-identified object by providing a semiconductor structure comprising:

a substrate having a first conductive type;

a deep well having a second conductive type, extending down from a surface of the substrate;

two first wells having the first conductive type, extending down from the surface of the substrate and formed within the deep well;

a second well having the first conductive type, extending down from the surface of the substrate and formed between the two first wells within the deep well, and an implant dosage of the second well lighter than an implant dosage of each of the two first wells; and two first doping regions having the first conductive type, respectively formed within the two first wells and extending down from the surface of the substrate.

The invention achieves the above-identified object by providing a method for manufacturing a semiconductor structure, comprising:

providing a substrate having a first conductive type;

forming a deep well extending down from a surface of the substrate, and the deep well having a second conductive type;

forming two first wells and a second well within the deep well, the second well positioned between the two first wells, an implant dosage of the second well lighter than an implant dosage of each of the two first wells, the two first wells and the second well having the first conductive type and extending down from the surface of the substrate; and forming two first doping regions respectively within the two first wells and extending down from the surface of the substrate, and the two first doping regions having the first conductive type.

Other objects, features, and advantages of the present invention will become apparent from the following detailed description of the preferred but non-limiting embodiment. The following description is made with reference to the accompanying drawings.

DETAILED DESCRIPTION OF THE INVENTION

A semiconductor structure with high breakdown voltage and high resistance is provided in the present invention. It is noted that the embodiment disclosed herein is used for illustrating the invention, but not for limiting the scope of the invention. Additionally, the drawings used for illustrating the embodiment of the present invention only show the major characteristic parts in order to avoid obscuring the present invention. Accordingly, the specification and the drawings are to be regard as an illustrative sense rather than a restrictive sense.

Figure 1:
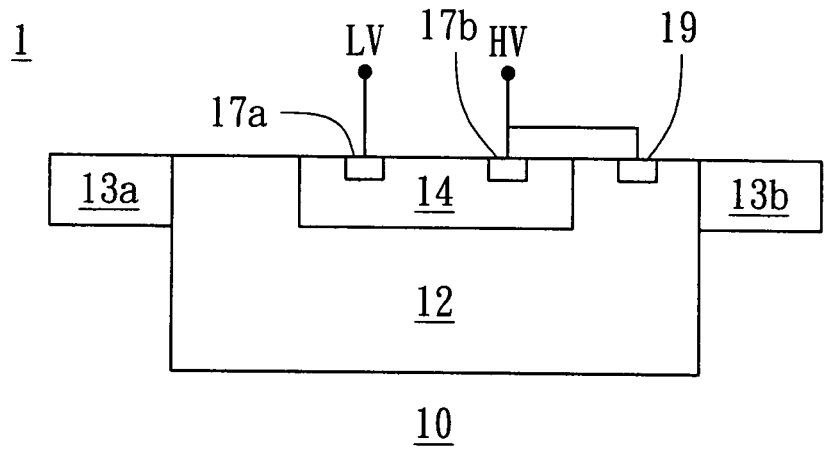
FIG. 1 (Prior Art) is a cross-sectional view of a conventional resistor device.
Figure 2:
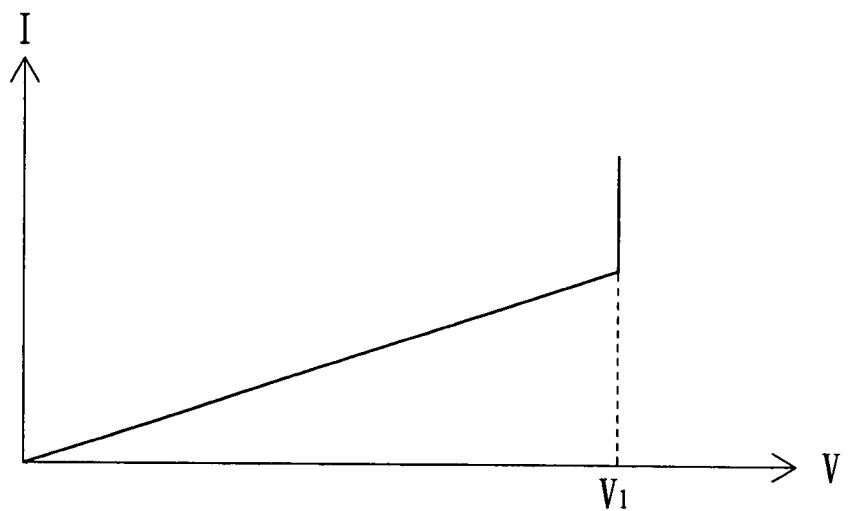
FIG. 2 (Prior Art) presents a typical I-V curve of the conventional resistor device of FIG. 1.
Figure 3:
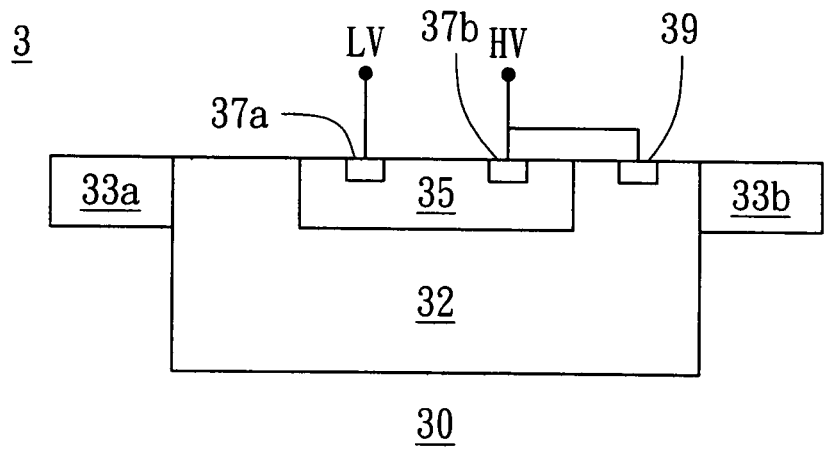
FIG. 3 (Prior Art) is a cross-sectional view of another conventional resistor device.
Figure 4:
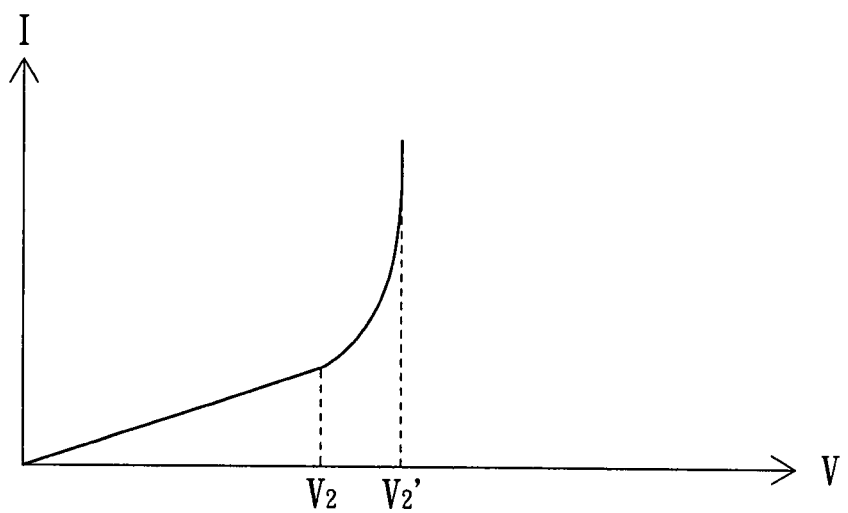
FIG. 4 (Prior Art) presents a typical I-V curve of the conventional resistor device of FIG. 3.
Figure 5:
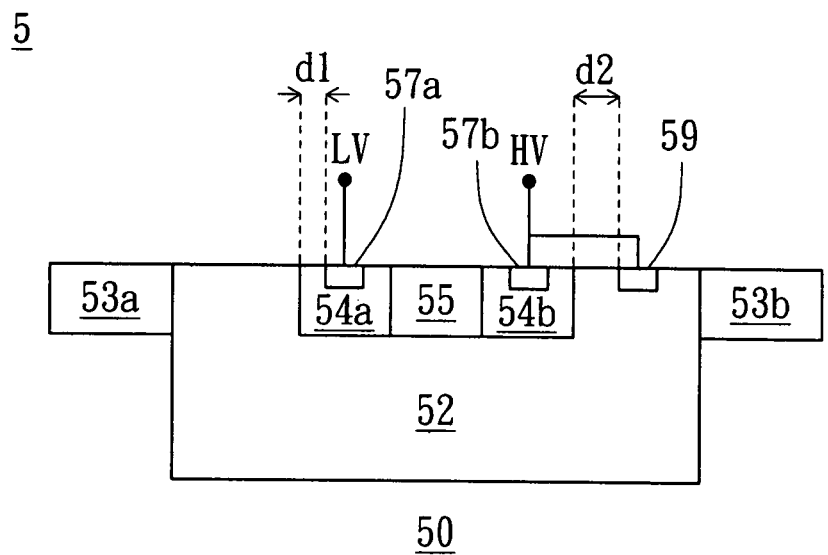
FIG. 5 is a cross-sectional view of a resistor device according to embodiment of the present invention.

FIG. 5 is a cross-sectional view of a resistor device according to embodiment of the present invention. The semiconductor structure 5 includes a substrate 50, a deep well 52, two first wells 54a and 54b, a second well 55, two third wells 53a and 53b, two first doping regions 57a and 57b, and a second doping region 59. The substrate 50 has a first conductive type such as P-type, and could be made of silicon. The deep well 52 has a second conductive type, and an N deep well could be formed as the deep well 52 of the embodiment. The two first wells 54a and 54b, the second well 55 and the two third wells 53a and 53b have the first conductive type, such as the P-type. The two third wells 53a and 53b contact the outsides of the deep well 52. The two first wells 54a and 54b and the second well 55 are formed within the deep well. Also, the second well 55 is sandwiched between the two first wells 54a and 54b (i.e. the two first wells 54a and 54b respectively contacting two sides of the second well 55), and an implant dosage of the second well 55 is lighter than an implant dosage of each of the two first wells 54a and 54b. Moreover, the two third wells 53a and 53b are implanted with a higher implant dosage than the second well 55. In practical applications, a ratio of the implant dosage of the second well 55 to the implant dosage of each of the two first wells 54a and 54b could be optionally selected in a range of about 0.1 to about 0.9.

The two first doping regions 57a and 57b have the first conductive type and the second doping region 59 has the second conductive type. In the embodiment, P+ regions could be formed as the two first doping regions 57a and 57b, and the N+ regions could be formed as the second doping region 59. The two first doping regions 57a and 57b are formed within the two first wells 54a and 54b, respectively. The second doping region 59 is formed within the deep well 52 and spaced from the first doping region 57b. Structurally, the second doping region 59 is also isolated from the two third wells 53a and 53b and the substrate 50 by the deep well 52.

Furthermore, a low voltage end (LV) is connected to the first doping region 57a, and a high voltage end (HV) is connected to the first doping region 57b and the second doping region 59.

Structurally, the deep well 52, the two first wells 54a and 54b, the second well 55, the two third wells 53a and 53b, the two first doping regions 57a and 57b, and the second doping region 59 are formed by extending down from a surface of the substrate 50.

Figure 6:
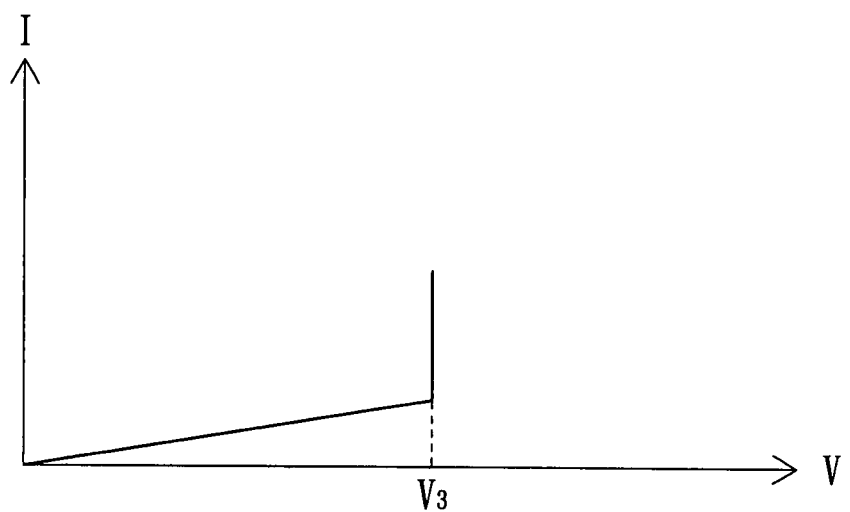
FIG. 6 presents an I-V curve of the resistor device of FIG. 5.

FIG. 6 presents an I-V curve of the resistor device of FIG. 5. For the structure 5 of FIG. 5, junction breakdown happens at the interface between the deep well 52 and one of the two third wells 53a and 53b. As shown in FIG. 6, when the semiconductor structure 5 is operated at the voltage V3 (depending on the dosages of the deep well 52 and the two third wells 53a and 53b), junction breakdown happens and the current increases sharply. Accordingly, the semiconductor structure 5 of FIG. 5 possesses the "hard breakdown" characteristics, and has no issue of current leakage. Compared to the semiconductor structure 3, the voltage V3 is relatively larger than the voltage V2. Thus, the semiconductor structure 5 of the embodiment is suitable for being operated at a high voltage. Furthermore, compared to the semiconductor structure 1, the resistance (depending on the dosage of the second well 55 and the deep well 52) of the semiconductor structure 5 is relatively larger than the resistance of the semiconductor structure 1. Thus, the semiconductor structure 5 of the embodiment has a high resistance.

The semiconductor structure according to embodiment of the present invention can be manufactured by using the method described below.

First, a substrate 50 having a first conductive type, such as a P-substrate, is provided. The substrate 50 is implanted and subjected to a thermo-process to form a deep well 52 having a second conductive type, such as an N deep well. The deep well 52 is extended down from a surface of the substrate 52. Then, two first wells 54a and 54b, a second well 55 and two third wells 53a and 53b having the first conductive type, such as P-wells, are formed by implanting with suitable implant dosages and subjecting to the thermo-process. The two third wells 53a and 53b are formed in the substrate 50. The two first wells 54a and 54b and the second well 55 are formed within the deep well 52. The second well 55 has the lightest implant dosage than one of the first and third wells (54a, 54b, 53a, or 53b). Also, the two third wells 53a and 53b, the two first wells 54a and 54b and the second well 55 are extended down from the surface of the substrate 52 by a conventional masking and implantation process. Next, two first doping regions 57a and 57b having the first conductive type (such as P+ regions) are respectively formed within the two first wells 54a and 54b, and a second doping region 59 having the second conductive type (such as N+ region) is formed within the deep well. The second doping region 59 is isolated from the first wells 54b and the third well 53b by the deep well 52. The two first doping regions 57a and 57b and the second doping region 59 are extended down from the surface of the substrate 50. Subsequent processes, such as connecting a high voltage end to the second doping region 59 and the first doping region 57b, and connecting a low voltage end to the first doping region 57a, and other steps, are performed to finish the semiconductor manufacture.

In practical applications, a ratio of the implant dosage of the second well 55 to the implant dosage of one of the two first wells 54a and 54b could be optionally selected in a range of about 0.1 to about 0.9. The deep well 52 could be implanted with an implant dosage of about $1\times10^{12}/cm^2$ to about $5\times10^{13}/cm^2$. The two third wells 53a and 53b and the two first wells 54a and 54b could be implanted with an implant dosage of about $1\times10^{12}/cm^2$ to about $3\times10^{13}/cm^2$. The two first doping regions 57a, 57b and second doping region 59 could be doped with a dosage of about $1\times10^{15}/cm^2$ to about $5\times10^{16}/cm^2$. Also, resistance of the substrate 52 could be in a range of about 10 ohm-cm to about 100 ohm-cm. The deep well 52 could have a depth of about 2 μm to about 10 μm. The two third wells 53a and 53b, the two first wells 54a and 54b and the second well 55 could have a depth of about 1 μm to about 5 μm. Further, each of the two first doping regions 57a and 57b could be spaced from the second well 55 at a distance d1 of about 1 μm to about 3 μm. The second doping region 59 could be spaced from the first well 54b at a distance d2 of about 1 μm to about 3 μm.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, at least comprising:
    a substrate having a first conductive type;
    a deep well having a second conductive type, extending down from a surface of the substrate;
    two first wells having the first conductive type, extending down from the surface of the substrate and formed within the deep well;
    a second well having the first conductive type, extending down from the surface of the substrate and formed between the two first wells within the deep well, and an implant dosage of the second well lighter than an implant dosage of each of the two first wells, wherein the second well and the two first wells have the same well depths;
    two first doping regions having the first conductive type, respectively formed within the two first wells and spaced apart from the second well, wherein the two first doping regions extend down from the surface of the substrate and an implant dosage of each of the two first doping regions is higher than the implant dosage of each of the two first wells; and
    two third wells having the first conductive type, extending down from the surface of the substrate and respectively contacting two outer side surfaces of the deep well.

2. The semiconductor structure according to claim 1, further comprising: a second doping region having the second conductive type, extending down from the surface of the substrate and formed within the deep well, and the second doping region being isolated from the two first wells.

3. The semiconductor structure according to claim 2, further comprising:
    a high voltage end, connected to the second doping region and one of the two first doping regions; and
    a low voltage end, connected to the other first doping region.

4. The semiconductor structure according to claim 2, wherein the second doping region is spaced from one of the two first wells at a distance of about 1 μm to about 3 μm.

5. The semiconductor structure according to claim 2, wherein the second doping region is isolated from the two third wells and the substrate by the deep well.

6. The semiconductor structure according to claim 2, wherein the substrate is a P-substrate, the deep well is a N-deep well, the two first wells and the two third wells are a plurality of P-wells, the second well is a P-type body, the two first doping regions are P+ doping regions, and the second doping region is n+ doping region.

7. The semiconductor structure according to claim 2, wherein each of the two first wells and the two third wells has a depth of about 1 μm to about 5 μm.

8. The semiconductor structure according to claim 2, wherein the implant dosage of the second well is lighter than an implant dosage of each of the two third wells.

9. The semiconductor structure according to claim 1, wherein the two first wells contact two sides of the second well respectively.

10. The semiconductor structure according to claim 1, wherein the deep well has a depth of about 2 μm to about 10 μm.

11. The semiconductor structure according to claim 1, wherein the second well has a depth of about 1 μm to about 5 μm.

12. The semiconductor structure according to claim 1, wherein one of the two first doping regions is spaced from the second well at a distance of about 1 μm to about 3 μm.

* * * * *